(12) United States Patent
Sugiura

(10) Patent No.: US 6,661,290 B2
(45) Date of Patent: Dec. 9, 2003

(54) HIGH-FREQUENCY POWER AMPLIFIER

(75) Inventor: Masayuki Sugiura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/050,590

(22) Filed: Jan. 18, 2002

(65) Prior Publication Data

US 2002/0097097 A1 Jul. 25, 2002

(30) Foreign Application Priority Data

Jan. 19, 2001 (JP) ........................................ 2001-011969

(51) Int. Cl.$^7$ ................................................. H03F 3/68
(52) U.S. Cl. ....................... 330/289; 330/295; 330/296
(58) Field of Search ................................ 330/289, 295, 330/296

(56) References Cited

U.S. PATENT DOCUMENTS

| | | | |
|---|---|---|---|
| 5,629,648 A | 5/1997 | Pratt | 330/289 |
| 6,018,270 A * | 1/2000 | Stuebing et al. | 330/289 |
| 6,448,859 B2 * | 9/2002 | Morizuka | 330/295 |

FOREIGN PATENT DOCUMENTS

JP    2000-332124    11/2000

* cited by examiner

*Primary Examiner*—Steven J. Mottola
(74) *Attorney, Agent, or Firm*—Oblon, Spivak, McClelland, Maier & Neustadt, P.C.

(57) ABSTRACT

The present invention includes: a plurality of high-frequency amplifier sections, each being composed of bipolar transistors; capacitors, each corresponding to one of the high-frequency amplifier sections, one end of each capacitor being connected to the bases of the bipolar transistors in the corresponding high-frequency amplifier section, and the other end thereof being connected to a high-frequency signal source; and bias circuits, each corresponding to one of the high-frequency amplifier sections, supplying a bias voltage to the bases of the bipolar transistors of the corresponding high-frequency amplifier section. Each bias circuit has a bias voltage lowering section, which is located close to the bipolar transistors of the corresponding high-frequency amplifier section to reduce the bias voltage in response to a rise in temperature of the bipolar transistors.

10 Claims, 13 Drawing Sheets

HIGH-FREQUENCY POWER AMPLIFIER

CROSS-REFERENCE TO RELATED APPLICATIONS

This application is based upon and claims the benefit of priority from the prior Japanese Patent Application No. 2001-11969, filed on Jan. 19, 2001, the entire contents of which are incorporated herein by reference.

BACKGROUND OF THE INVENTION

1. Field of the Invention

The present invention relates generally to high-frequency power amplifiers using bipolar transistors, and more particularly, to a high-frequency power amplifier with high-efficiency and low-distortion characteristics, using heterojunction bipolar transistors.

2. Related Background Art

Recently, transistors for amplifying electric power highly efficiently in a frequency band of 1 GHz or more are indispensable to mobile information terminals such as mobile phones. Among such transistors, heterojunction bipolar transistors formed on substrates of compound semiconductors such as GaAs have attracted widespread attention. The reason for this is that since they are superior in high-frequency characteristics, and operate highly efficiently with low voltage, they meet the demand for reducing the number of cells to reduce weight of mobile phones or mobile terminals, while accomplishing a long-time operation. In addition, since a heterojunction bipolar transistor shows small third order intermodulation distortion, it is suitable for digital modulation requiring highly linear operations.

Thus, a heterojunction bipolar transistor using a compound semiconductor has superior characteristics in principle. However, sometimes it occurs that such characteristics are deteriorated in an effort to obtain a high output power. This attributes to the fact that when the output level is raised, the temperature of the devices tends to increase due to the characteristics of bipolar transistors and the fact that the thermal conductivity of compound semiconductor substrates is generally low.

It is known that if a bipolar transistor is driven with a constant base-emitter voltage, the collector current increases due to the decrease in the ON voltage caused by the increase in temperature. As the current increases, the power consumption increases. Consequently, the temperature of the device increases due to the low thermal conductivity. As a result, a vicious circle occurs that a far greater current flows to further increase the power consumption. Accordingly, in a large-scale high-frequency power amplifier having a plurality of transistors, the temperature of devices located in the center portion, in which heat is not easily conveyed, raises sharply, thereby causing an imbalanced current distribution. In such a case, the characteristics of the power amplifier are limited by the transistor through which the highest amount of current flows, and deteriorated. In the worst case, the power amplifier is brought into a thermal runaway state, by which the transistors thereof are destroyed.

In order to deal with the above-described problems, a method using a ballast resistor has conventionally been employed, in which emitter resistance or base resistance is increased to provide negative feedback to the base-emitter voltage in order to deal with a current increase. Because of the negative feedback, it is possible to compensate for the increase in collector current caused by the increase in temperature, thereby preventing thermal runaway. FIG. 13 shows a circuit configuration of a conventional high-frequency power amplifier, which is intended to be thermally stabilized by increasing base resistance.

The conventional high-frequency power amplifier in FIG. 13 includes a low-output-impedance voltage generator 7 used as a bias circuit, ballast resistors $12_1$–$12_4$, high-frequency amplifier sections $30_1$–$30_4$, and an MIM (Metal Insulator Metal) capacitor 80.

The voltage generator 7 includes a diode D1 of which the cathode is grounded, a diode D2 of which the cathode is connected to the anode of the diode D1, a control resistor 8 of which one end is connected to the anode of the diode D2 and the other end is connected to a control power supply 200, an NPN-type bipolar transistor Q1 of which the collector is connected to a bias power supply 210 and the base is connected to the anode of the diode D2, and a resistor 9 of which one end is connected to the emitter of the bipolar transistor Q1 and the other end is grounded. Each high-frequency power amplifier section $30_i$(i=1, ..., 4) is composed of a plurality of NPN-type bipolar transistors 31 of which the collectors are connected to a high-frequency output terminal, the bases are commonly connected, and the emitters are grounded. One end of each ballast resistor $12_i$(i=1, ..., 4) is connected to a high-frequency signal source 220 via the MIM capacitor 80, and the other end is connected to the bases of the transistors 31 of the high-frequency amplifier section $30_i$.

In this conventional high-frequency power amplifier, a base voltage generated by the voltage generator 7 is applied to the bases of the transistors 31 via the ballast resistor $12i$ provided to the high-frequency amplifier section $30_i$ (i=1, ..., 4). With such a circuit configuration, even in the case where the ON voltage of the transistors 31 is lowered by the increase in temperature, thereby increasing the current, it is possible to compensate for the decrease in the ON voltage with the voltage drop caused by the current flowing through the ballast resistor $12_i$ (i=1, ..., 4), thereby preventing thermal runaway. Further, with such a function, it is possible to prevent the imbalance in current distribution, thereby preventing characteristic deterioration of the high-frequency power amplifier.

It is understood, from the above descriptions, that when a ballast resistance is increased, the resistance properties of the circuit against thermal runaway are improved, thereby relieving the imbalanced current distribution problem. However, if the ballast resistance is increased too much, the following problems arise. First problem is gain reduction. As understood from the circuit configuration shown in FIG. 13, high-frequency signals are sent to the transistors 31 via the ballast resistors $12_i$ (i=1, ..., 4). As a result, a power loss due to the resistance occurs to reduce the gain of the power amplifier. Further, as the gain is reduced, the power added efficiency of the power amplifier is also reduced. Second problem is reduction in saturation peak output power of the power amplifier. In principle, a ballast resistor has an effect of inhibiting increase in current. Accordingly, as the ballast resistance value increases, the maximum current value of the current flowing through the transistors 31 is reduced. As a result, the peak power that can be outputted from the transistors 31 is reduced. Accordingly, a problem arises that a larger power amplifier would be required for obtaining the same output. Third problem is shift of bias point caused by ballast resistor. The increase in base current is not only caused by heat but also at the time when power is dramatically amplified. If the bias point is set to be class B in order to improve efficiency, the variation is remarkable. The ballast resistor works to reduce the base voltage in response to such a variation in base current. As a result, the bias point shifts. Since such a shift in bias point causes variations in the amplifying characteristics and the phase characteristics, it can constitute a factor of deteriorating the linearity of the amplifier.

Accordingly, it is understood that the circuit shown in FIG. 13 has the limit to improve characteristics such as the gain or the output of the power amplifier while at the same time seeking thermal stability. In order to cope with such a problem, a method is proposed in which the bias circuit, i.e., the voltage generating circuit 7, is separated from the high-frequency input section composed of the MIM capacitor 80 and the ballast resistors $12_1$–$12_4$. A conventional structure of such a high-frequency power amplifier is shown in FIG. 14, in which a voltage generating circuit 7 and a high-frequency input section are separated from each other. The conventional high-frequency power amplifier shown in FIG. 14 is obtained by replacing the MIM capacitor 80 in the high-frequency power amplifier shown in FIG. 13 with MIM capacitors $20_i$ (i=1, . . . , 4) each corresponding to one of the high-frequency amplifier sections $30_i$ (i=1, . . . , 4). One end of each MIM capacitor $20_i$ is connected to a high-frequency signal source 220, and the other is connected to a connection node between a ballast resistor $12_i$ and the bases of transistors 31.

In the conventional high-frequency power amplifier shown in FIG. 14, high-frequency signals are supplied to each high-frequency amplifier sections $30_i$ (i=1, . . . , 4) via a separate MIM capacitor $20_i$, independently of the bias circuit, i.e., the voltage generating circuit 7. That is, high-frequency signals are supplied without passing through the ballast resistors $12_i$. In this conventional high-frequency power amplifier, even if the resistance value of the ballast resistors is increased to secure thermal stability, no power loss is caused by the resistance. Accordingly, it is possible to inhibit the decrease in gain, thereby solving the above-described first problem. However, the situation has not changed for the above-described second and third problems, i.e., the problems of the reduction in saturation peak output power and the linearity. Therefore, the problem remains that the ballast resistance value cannot be excessively increased to seek the thermal stability.

SUMMARY OF THE INVENTION

A high-frequency power amplifier according to a first aspect of the present invention includes: a plurality of high-frequency amplifier sections, each being composed of bipolar transistors; a plurality of capacitors each corresponding to one of the high-frequency power amplifier sections, one end of each capacitor being connected to bases of the bipolar transistors of the corresponding high-frequency power amplifier section, and the other end thereof being connected to a high-frequency signal source; and a plurality of bias circuits each corresponding to one of the high-frequency power amplifier sections, applying a bias voltage to the bases of the bipolar transistors of the corresponding high-frequency power amplifier section, wherein each bias circuit is located close to the corresponding one of the high-frequency power amplifier sections, and includes a bias voltage lowering section lowering the bias voltage in response to a increase in temperature of the bipolar transistors.

A high-frequency power amplifier according to a second aspect of the present invention includes: a plurality of high-frequency amplifier sections, each being composed of bipolar transistors; a plurality of capacitors each corresponding to one of the high-frequency power amplifier sections, one end of each capacitor being connected to bases of the bipolar transistors of the corresponding high-frequency amplifier section, and the other end thereof being connected to a high-frequency signal source; and a plurality of bias circuits each corresponding to one of the high-frequency power amplifier sections, applying a bias voltage to the bases of the bipolar transistors of the corresponding high-frequency power amplifier section, wherein each of the bias circuits has a function to control a base current supplied to the bases of the bipolar transistors in the corresponding high-frequency section so as not to exceed a predetermined value.

DESCRIPTION OF THE EMBODIMENTS

Hereinafter, embodiments of the present invention will be described with reference to the accompanying drawings.
(First Embodiment)

Figure 1:
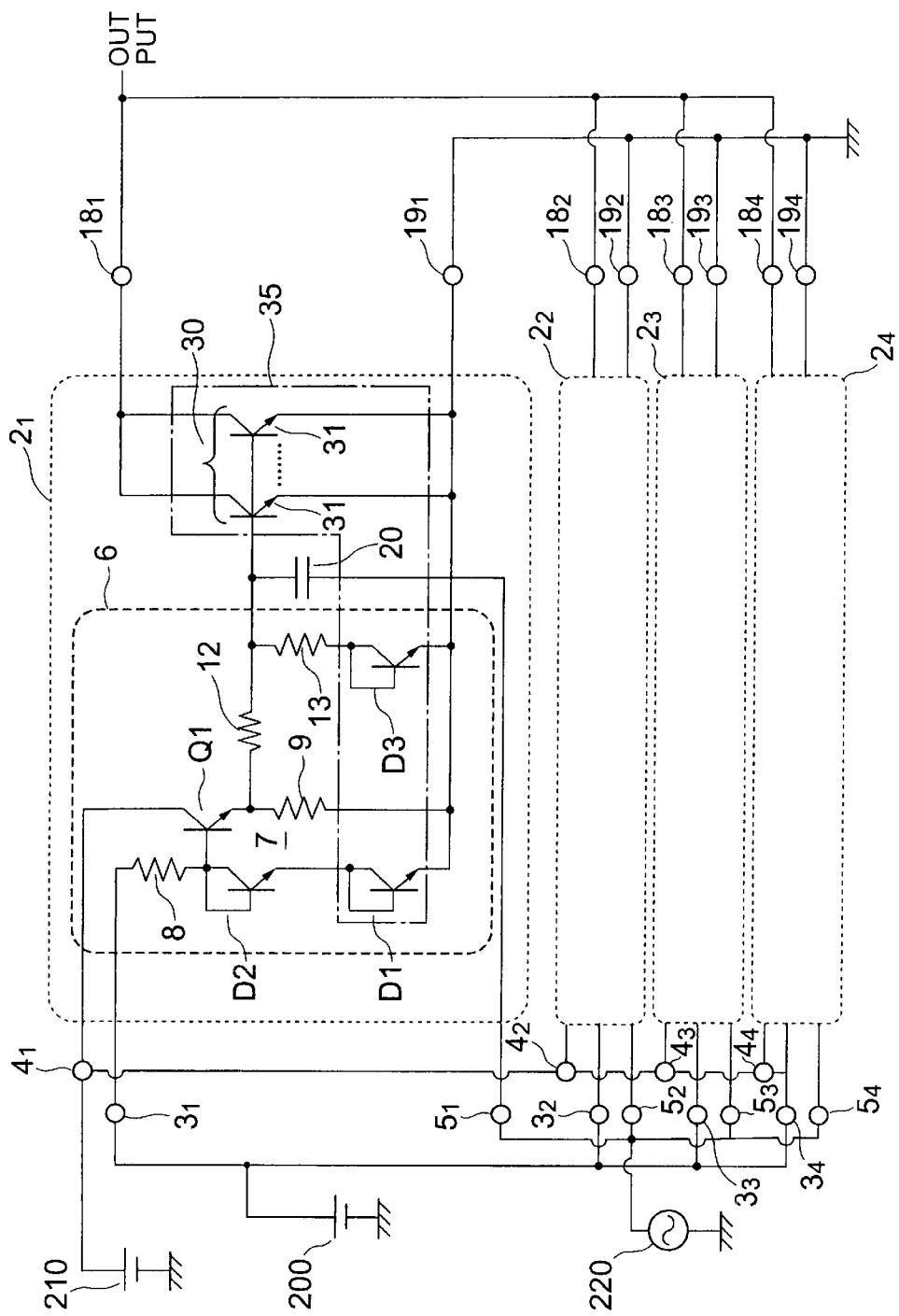
FIG. 1 is a circuit diagram showing a high-frequency power amplifier according to a first embodiment of the present invention.

FIG. 1 shows the configuration of a high-frequency power amplifier according to a first embodiment of the present invention. In this embodiment, the high-frequency power amplifier is composed of InGaP/GaAs heterojuncion bipolar transistors formed on a GaAs substrate, and is intended to operate in the 2 GHz frequency band. In this embodiment, 32 NPN-type bipolar transistors 31 as amplifier devices, each having an emitter region measuring 4×30 $\mu m^2$, are divided into four units $2_1$, $2_2$, $2_3$, and $2_4$. Each unit $2_i$ (i=1, 2, 3, 4) includes a control terminal $3_i$, a bias DC terminal $4_i$, a high-frequency input terminal $5_i$, a bias circuit 6, an MIM (Metal Insulator Metal) capacitor 20, a high-frequency amplifier section 30, an output terminal $18_i$, and a grounding terminal $19_i$.

The bias circuit 6 includes a voltage generating circuit 7 having a control resistor 8, a resistor 9, an NPN-type bipolar transistor Q1, a diode D1, and a diode D2, a ballast resistor 12, a high-frequency inhibiting resistor 13, and a diode D3. The voltage generating circuit 7 of each unit $2_i$ (i=1, 2, 3, 4) is adjusted to have a low output impedance by the use of an emitter-follower circuit. One end of the control resistor 8 is connected to a control power supply 200 via the control terminal $3_i$ of the corresponding unit $2_i$ (i=1, 2, 3, 4), and the other end is connected to the anode of the diode D2. The anode of the diode D1 is connected to the cathode of the diode D2, and the cathode thereof is grounded via the grounding terminal $19_i$. The collector of the transistor Q1 is connected to a bias power supply 210 via the bias DC terminal $4_i$, the base thereof is connected to the anode of the diode D2, and the emitter thereof is connected to the grounding terminal $19_i$ via the resistor 9. One end of the ballast resistor 12 is connected to the emitter of the transistor Q1, and the other end thereof is connected to one end of the resistor 13. The other end of the resistor 13 is connected to the anode of the diode D3. The cathode of the diode D3 is grounded via the grounding terminal $19_i$. The output of the bias circuit 6 is provided from the connection node between the ballast resistor 12 and the resistor 13. The control power supply 200, the control terminal $3_i$ (i=1, 2, 3, 4), and the control resistor 8 are provided to control bias conditions.

One end of the MIM capacitor 20 is connected to the output terminal of the bias circuit 6, and the other end thereof is connected to the high-frequency signal source 220 via the high-frequency input terminal $5_i$ of the corresponding unit $2_i$ (i=1, 2, 3, 4). The high-frequency power amplifier section 30 includes a plurality (in this embodiment, eight) of NPN-type bipolar transistors 31, which are connected in parallel. The collectors of the transistors 31 are connected to the output terminal $18_i$ of the corresponding unit $2_i$ (i=1, 2, 3, 4), the bases thereof are commonly connected to the output terminal of the bias circuit 6, and the emitters thereof are grounded via the grounding terminal $19_i$. The output of the high-frequency power amplifier in this embodiment is provided from the output terminal $18_i$ of each unit $2_i$ (i=1, 2, 3, 4).

Each unit $2_i$ (i=1, 2, 3, 4) has minimum functions to operate as an amplifier, and the entire power amplifier is constituted as an assembly of small amplifiers.

Further, the transistors 31 of the high-frequency amplifier section 30 and the diodes D1 and D3 operating as temperature monitors in the bias circuit 6 are strongly coupled thermally (see the area 35 shown by the chain line).

Figure 2:
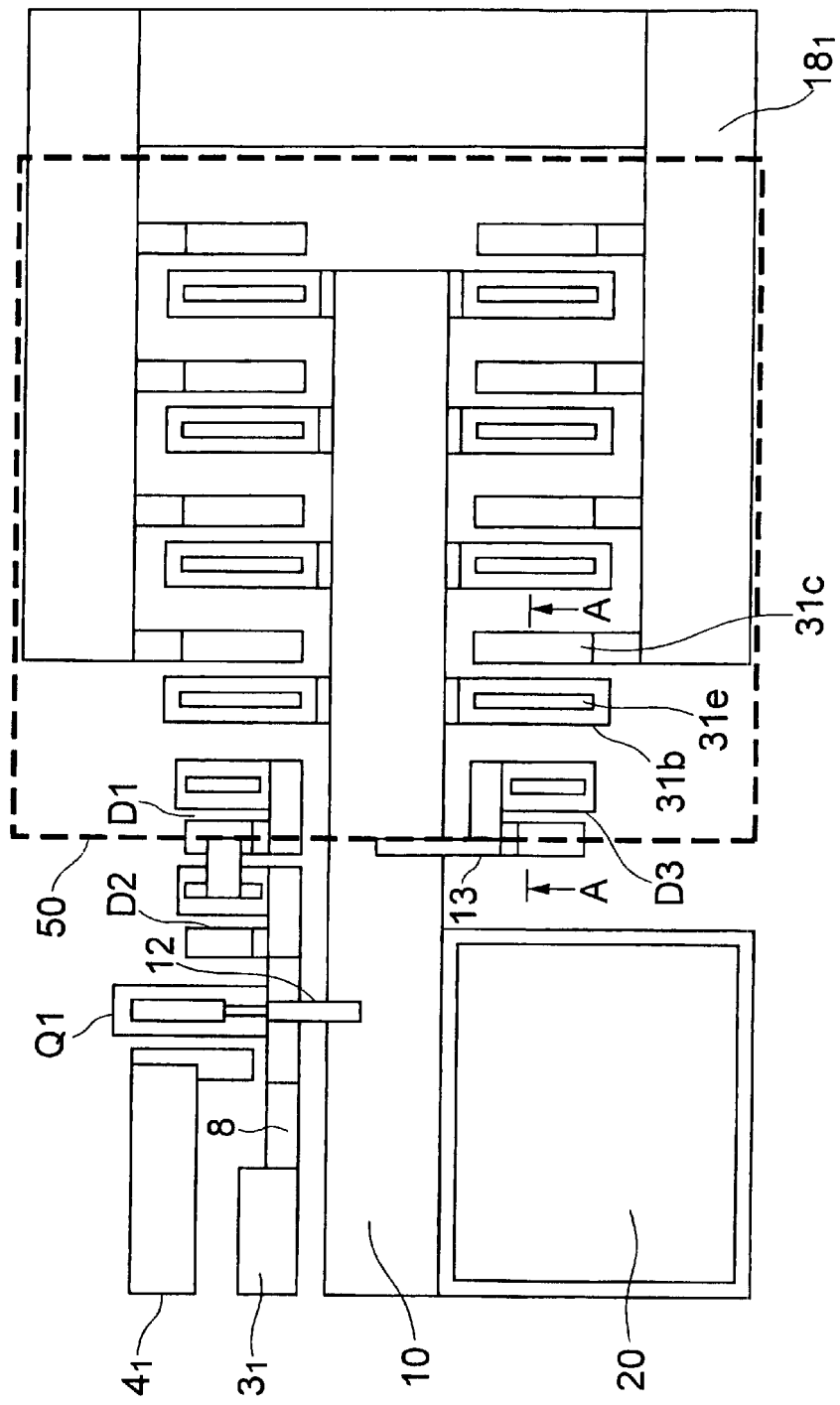
FIG. 2 is a plan view showing the layout of the high-frequency power amplifier of the first embodiment.

In order to accomplish the above-described thermal coupling, each unit $2_i$ (i=1, 2, 3, 4) has a layout as shown in FIG. 2. That is, the diodes D1 and D3, which operate as temperature monitors, are located as close to the transistors 31 operating as a heat source as possible. In FIG. 2, a metal wiring 10 connects the ballast resistor 12 and the MIM capacitor 20 with the bases of the transistors 31. In this drawing, the reference numerals 31b, 31c, and 31e denote base, collector, and emitter of a transistor 31, respectively.

Figure 3:
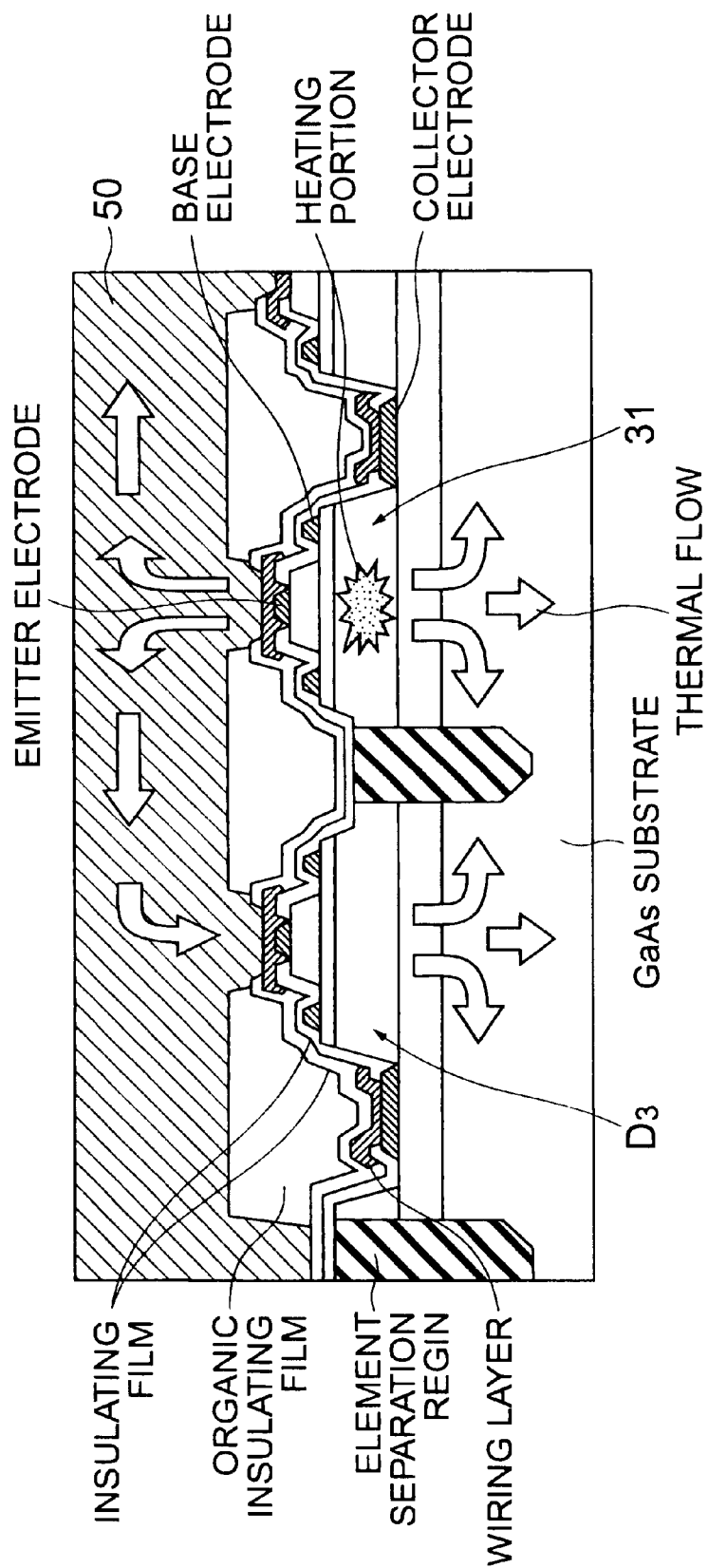
FIG. 3 is a sectional view taken along line A—A in FIG. 2.

FIG. 3 shows a sectional view of the high-frequency power amplifier of this embodiment taken on line A—A of FIG. 2. As shown in FIG. 3, in this embodiment, the emitter electrodes of the transistors 31 and the cathode of the diode D3 are thermally coupled by a thick plated line 50. As understood from FIG. 2, the cathode of the diode D1 is also coupled to the emitters of the transistors 31 by the thick plated line 50. Accordingly, heat generated in the transistors 31 may escape to the substrate either directly or indirectly via the plated line 50 with a thickness of about 4 μm and having a high thermal conductivity, and the diodes D1 and D3. Because of the existence of this indirect thermal passage, it is possible for the diodes D1 and D3 to be more sensitive about the temperature of the transistors 31.

Figure 4:
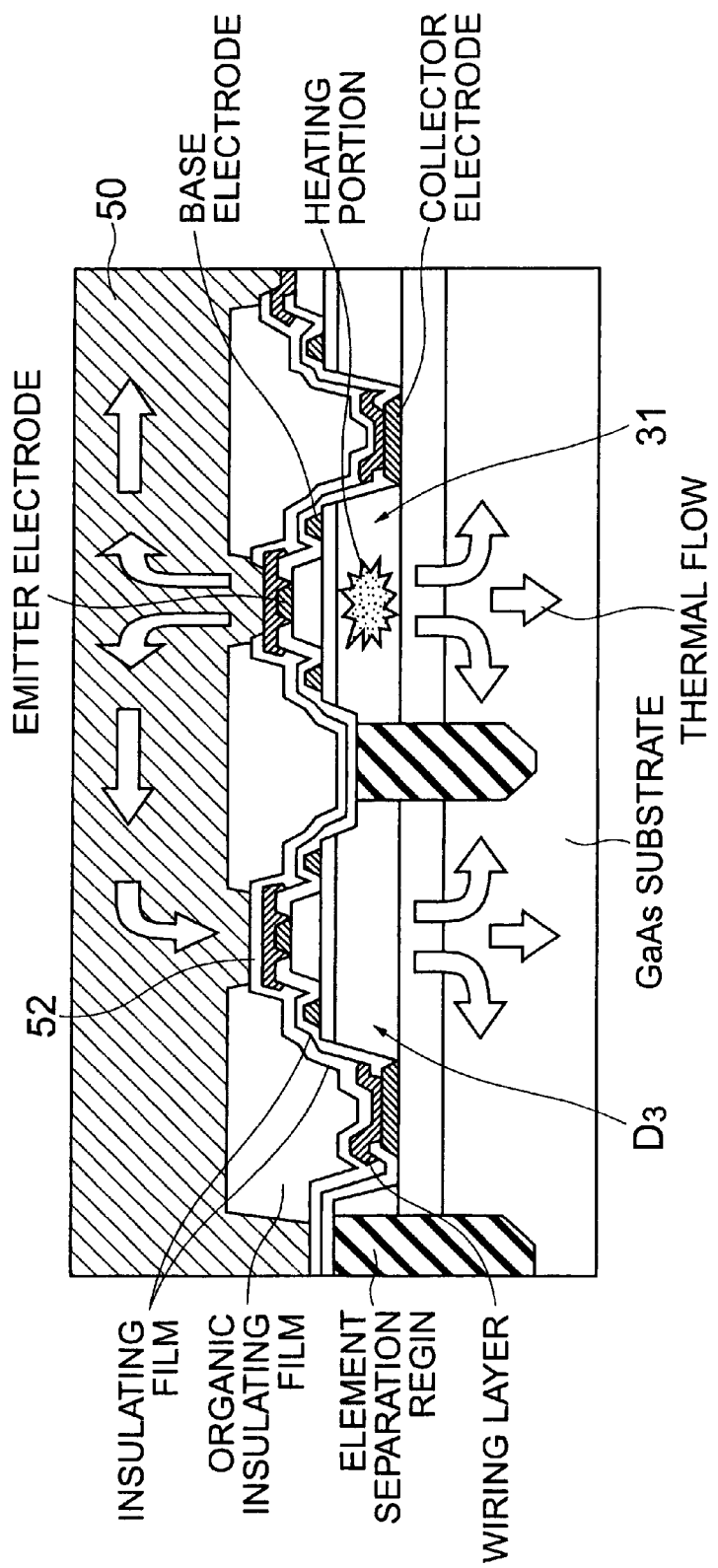
FIG. 4 is a sectional view showing a modification of the first embodiment.

In this embodiment, the plated line 50 also works as a grounding line. However, in the case where high-frequency signals should not be supplied to the side of the bias circuit 6 via the grounding line, the plated line 50 electrically connected to the emitter electrodes of the transistors 31 should be coupled with the cathodes of the diodes D1 and D3 via a thin insulating film 52, as shown in FIG. 4. In this way, it is possible to perform the thermal coupling without performing an electrical coupling. As a result, since the plated line 50 and the diodes D1 and D3 are electrically separated but thermally coupled via the thin insulating film 52, it is possible to achieve the intended structure. At this time, electrical wiring of the diodes D1 and D3 can be performed by the use of a metal wiring layer (not shown).

Next, operations of the bias circuit 6 of the high-frequency power amplifier of this embodiment shown in FIG. 1 will be described. In the voltage generating circuit 7 composed of the transistor Q1 and the diodes D1 and D2, the voltage is decreased in response to the increase in temperature by the use of the diode D1. That is, the output voltage is lowered by using the feature of the diode D1 that as the temperature of the diode D1 increases, the ON voltage thereof decreases.

As in the case of the diode D1, the ON voltage of the diode D3 also decreases as the temperature thereof increases. Subsequently, the current flowing through the diode D3 increases. The increasing amount of the current flowing through the diode D3 is the increasing amount of the current flowing through the power amplifying transistors 31 times the current gain (hereinafter "β"). Accordingly, even if the area ratio of emitter areas of the diode D3 and the transistors 31 is considered, the current increasing amount of the diode D3 is a few times that of the transistors 31. As a result, the current flowing through the ballast resistor 12 increases to cause a voltage drop. Accordingly, it is possible to reduce the bias voltage of the transistors 31 as the temperature rises.

The resistor 13 connected in series with the diode D3 is necessary to prevent the loss of high-frequency signals through the diode D3. If the increase in sensitivity of the diode D3 is intended, the resistance value of the resistor 13 should be reduced. However, if the resistance value were reduced, the loss would be increased. Accordingly, it is not appropriate to simply reduce the resistance value. In this embodiment, since a transistor having an emitter area measuring 4×10 μm$^2$ is used as the diode D3 and a resistor having a resistance value of 75 Ω is used as the resistor 13, the sensitivity to temperature is secured to a certain degree, while the loss of high-frequency signals is inhibited.

With such a circuit configuration, it is possible to keep within a constant range the variations of the bias point in each unit $2_i$ (i=1, 2, 3, 4) caused by the heat from the transistors 31. In this way, if there is a temperature difference between the unit $2_i$ (i=2, 3) provided in the center potion in an IC chip where heat is not easily conveyed, and the unit $2_j$ (j≠i) provided around the peripheral portion where heat is relatively easily conveyed, it is possible to accomplish uniform operations since the bias points of the transistors are adjusted unit by unit.

Figure 14:
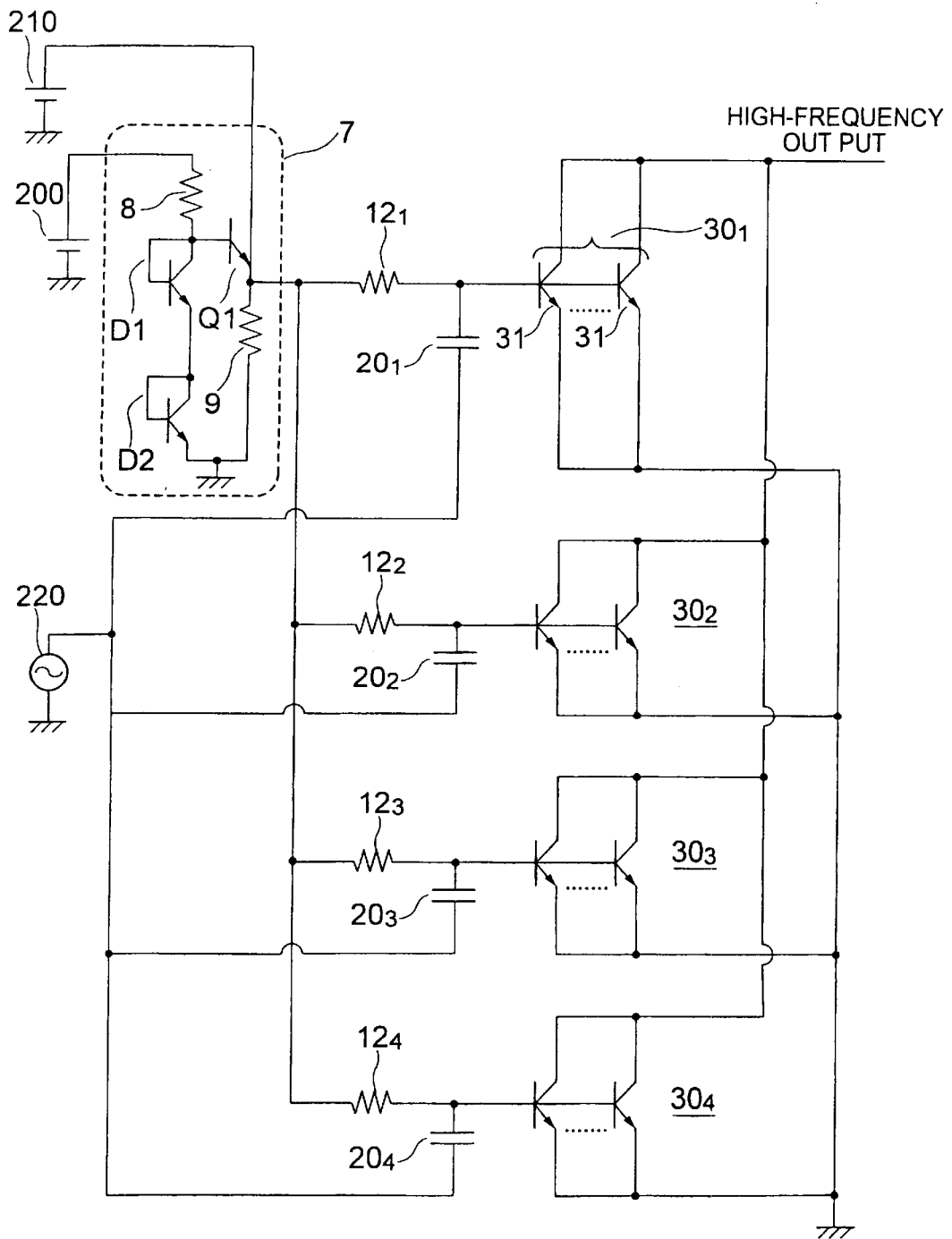
FIG. 14 is a circuit diagram showing the configuration of another conventional high-frequency power amplifier.

In the conventional configuration shown in FIG. 14, when a ballast resistor of 100 Ω is added per one transistor 31, a current of 185 mA flows through the two high-frequency amplifier sections $30_2$ and $30_3$ provided in the central portion, and a current of 140 mA flows through the two high-frequency amplifier sections $30_1$ and $30_4$ provided at the outer portions. Thus, there is about 30% difference between the central portion and the outer portion.

In contrast with this, in the high-frequency power amplifier of this embodiment shown in FIG. 1, when a ballast resistor 12 of 12.5 Ω is added per one high-frequency amplifier section (i.e., the total ballast resistance per one transistor is 12.5 Ω×8=100 Ω, which is the same as that of the above-described conventional power amplifier), a current of 170 mA flows through the high-frequency amplifier section 30 in the units $2_2$ and $2_3$ provided in the central portion, and a current of 155 mA flows through the high-frequency amplifier section 30 in the units $2_1$ and $2_4$ provided in the outer portions. Thus, it is possible to inhibit the difference to be lower than 10%, thereby improving the uniformity in operations.

Further, since the units operate uniformly, it is possible to further reduce the resistance value of the ballast resistor 12, which is necessary for securing the thermal stability. In the conventional high-frequency power amplifier shown in FIG. 14, the ballast resistance value required to prevent the transistors 31 from being destroyed even if a large collector current flows due to variations in the load impedance is 200 Ω per one transistor as a ballast resistor.

In this embodiment, however, the transistors 31 are not destroyed even when the resistance value per one high-frequency amplifier section is 12.5 Ω (the ballast resistance value for one transistor is 100 Ω, which is half of that of the conventional high-frequency power amplifier). Moreover, since the ballast resistance value is reduced, the saturation peak output power of the power amplifier is increased by more than 10%, as the saturation peak output power is improved from 32 dBmW to 32.5 dBmW.

In addition, there is an accompanying effect. Since the variations of bias point due to the ballast resistors become small, the phase characteristics and the linearity are improved. When compared under the same distortion condition, the output of this embodiment is about 0.5 dB higher than the conventional device as the saturation peak output power increases. Thus, the distortion characteristics are improved.

Further, since the high-frequency power amplifier of this embodiment includes a circuit in which the current increases in accordance with the temperature (the circuit including the diode D3), it is possible to accomplish a far more compensating operation with a smaller ballast resistor by reducing the resistance value of the high-frequency inhibiting resistor 13. In this case, the resistance value of the resistor 13 may ultimately be reduced such that the internal resistance of the voltage generating circuit 7 works as a ballast resistance. Thus, it is possible to accomplish the configuration in which the ballast resistance is 0 Ω.

(Second Embodiment)

Figure 5:
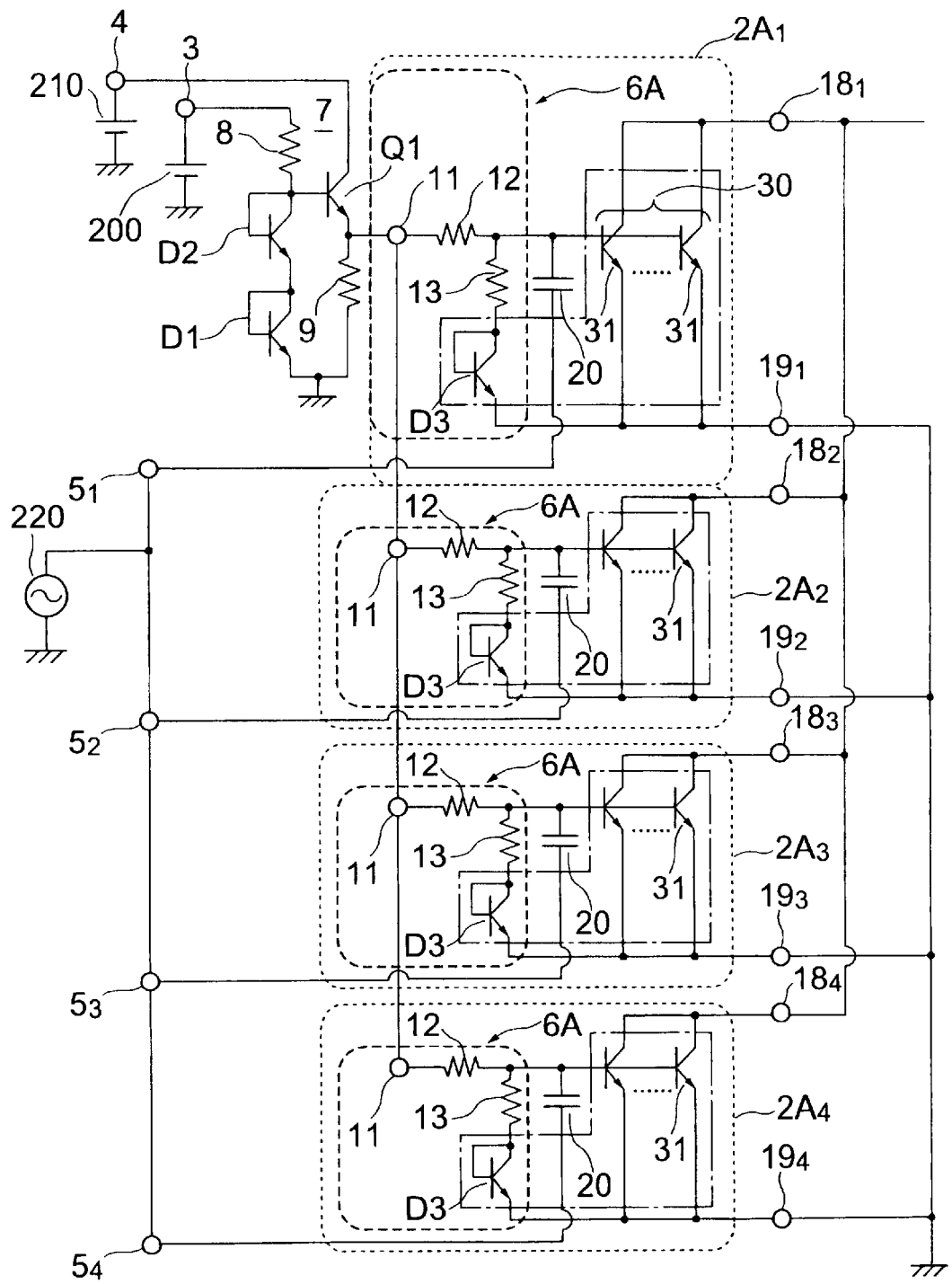
FIG. 5 is a circuit diagram showing a high-frequency power amplifier according to a second embodiment of the present invention.

Next, a high-frequency power amplifier according to a second embodiment of the present invention will be described with reference to FIG. 5.

The high-frequency power amplifier of this embodiment includes units $2A_1$–$2A_4$, a control terminal 3, a bias DC terminal 4, high-frequency input terminals $5_1$–$5_4$, a voltage generating circuit 7, output terminals $18_1$–$18_4$, and grounding terminals $19_1$–$19_4$. Each unit $2A_i$ (i=1, 2, 3, 4) is obtained by removing the voltage generating circuit 7 from a unit $2_i$ of the first embodiment. That is, each unit $2A_i$ (i=1, 2, 3, 4) includes a ballast resistor 12, a high-frequency inhibiting resistor 13, a diode D3, a MIM capacitor 20, and a high-frequency amplifier section 30 composed of a plurality of NPN-type transistors 31 connected in parallel with each other. As a substitute for the removed voltage generating circuits 7, a voltage generating circuit 7 is provided, which is common to all the units $2A_i$ (i=1, 2, 3, 4). Accordingly, a control resistor 8 of the voltage generating circuit 7 is connected to a control power supply 200 via the control terminal 3, and the collector of an NPN-type bipolar transistor Q1 is connected to a bias power supply 210 via the bias DC terminal 4. A bias voltage generated at the voltage generating circuit 7 is supplied to the ballast resistor 12 via a bias supplying terminal 11.

In the high-frequency power amplifier of the second embodiment thus constituted, the temperature monitor diode D1 in the voltage generating circuit 7 cannot supply an output voltage in accordance with the temperature of each unit $2A_i$ (i=1, 2, 3, 4) as in the case of the first embodiment. Accordingly, if the ballast resistance value of the ballast resistor 12 is small, it is not possible to inhibit variations in current in each unit, as in the case of the conventional device shown in FIG. 14. In order to cope with this problem, the diode D3 in each unit works as a temperature monitor in this embodiment. With this configuration, the bias point of the transistors 31 in the high-frequency amplifier section of each unit is controlled by a voltage depending on the ON voltage of the diode D3. The principle of this operation is the same as that of the first embodiment. In this context, in the second embodiment, a bias circuit 6A requiring a voltage substantially the same as that of the bias point of the transistors 31 is housed in each unit $2A_i$ (i=1, 2, 3, 4). Thus, each unit $2A_i$ has a function as an amplifier as in the case of the first embodiment. The bias circuit 6A is composed of the bias supplying terminal 11, the ballast resistor 12, the high-frequency inhibiting resistor 13, and the diode D3.

Figure 6:
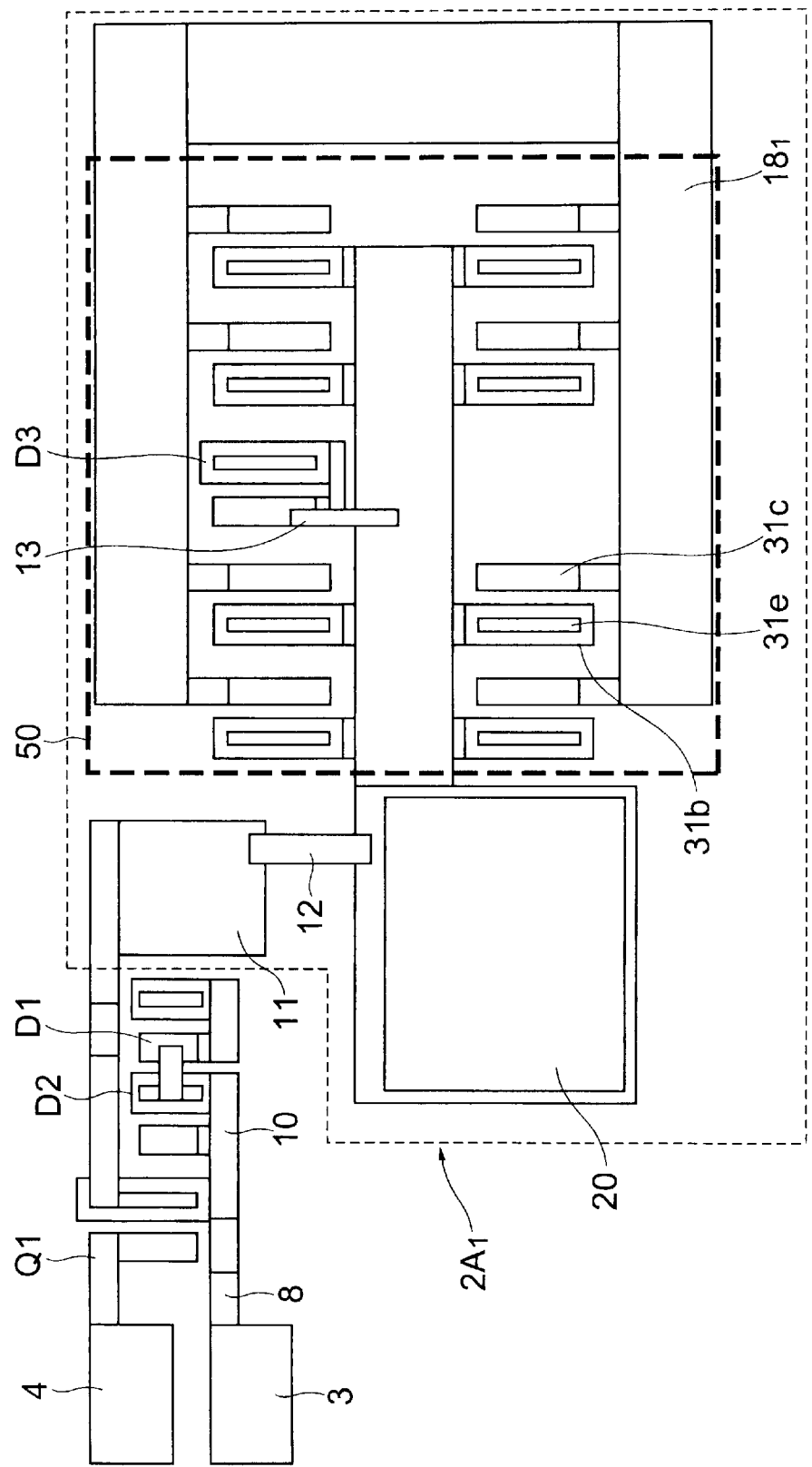
FIG. 6 is a plan view showing the layout of the high-frequency power amplifier of the second embodiment.

FIG. 6 shows a layout on an IC chip of the high-frequency power amplifier of the second embodiment. In FIG. 6, only one of the plural units $2A_1$–$2A_4$, e.g., $2A_1$, is shown, and the other units are omitted. As shown in FIG. 6, the temperature monitor diode D3 is provided in the central portion of the amplifying transistors 31, the temperature of which portion is the highest, so as to be more sensitive to the temperature of the transistors 31. Of course, as in the case of the first embodiment, a gold-plated line 50 thermally coupling the devices so as to accomplish a stronger thermal coupling. Further, a transistor having an emitter area measuring 4×30 $\mu m^2$, which is the same as that of the amplifying transistor 31, is used as the diode D3 so that a larger current variation occurs in response to a raise in temperature.

Next, the thermal stability of the bias point in the high-frequency power amplifier of the second embodiment will be described. In this embodiment, there is little thermal coupling between the temperature monitor diode D1 and the amplifying transistors 31. As a result, it seldom happens that the voltage generating circuit 7 itself reduces the bias voltage in accordance with the temperature, as in the case of the first embodiment.

Therefore, in this embodiment, a method is employed for compensating for the variations in the ON voltage of the transistors 31 by a voltage drop, which is caused when the current to be flown through the diode D3 flows through the ballast resistor 12. As understood from FIG. 5, since the transistors are used to constitute diodes, the variation in current of the diode D3 due to the variation in temperature is β times the variation in base current of the transistors 31.

The symbol $\beta$ represents the current gain. The actual current gain is "$\beta$ divided by the area ratio" since the emitter area of the high-frequency transistor is large. However, since the current gain $\beta$ of the transistors 31 is more than 100, a current variation of about ten to twenty times the variation in base current of the transistors 31 can be expected in this embodiment. Accordingly, a ballast resistor 12 having the resistance value of $\frac{1}{10}$ of the conventional device can inhibit the variation in bias point to the same degree as the conventional device.

However, as mentioned in the descriptions of the first embodiment, if the diode D3 is directly connected to the base of the transistor 31, a loss of high-frequency signals through the diode D3 occurs, thereby deteriorating the characteristics of the power amplifier. As mentioned previously, the high-frequency inhibiting resistor 13 is necessary to deal with this problem. Since this resistor inhibits the compensating operation of the bias point, however, the resistance value thereof should carefully be set.

In the layout shown in FIG. 6, the area of the diode D3 is relatively large in order to increase the current variation ratio. Further, a resistor having a resistance value of 12.5 Ω is used as the ballast resistor 12, and a thin-film resistor having a resistance value of 30 Ω is used as the high-frequency inhibiting resistor 13, as in the case with the first embodiment. With this configuration, the resistance value of the high-frequency inhibiting resistor 13 is smaller than that in the first embodiment. Therefore, the power gain is reduced by about 0.5 dB as compared to the conventional devices. However, it is possible to inhibit the deterioration in linearity caused by the movement of bias point in this embodiment. As a result, the 1 dB gain compression point, which can serve as a measure of the linearity, is 30.5 dBmW for the conventional devices, while that of this embodiment is 31.0 dBmW, which is improved by about 10%. Moreover, since no voltage generating circuit 7 is included in each unit $2A_i$ (i=1, 2, 3, 4), the circuit area can be reduced by 10% as compared with the first embodiment.

(Third Embodiment)

Figure 7:
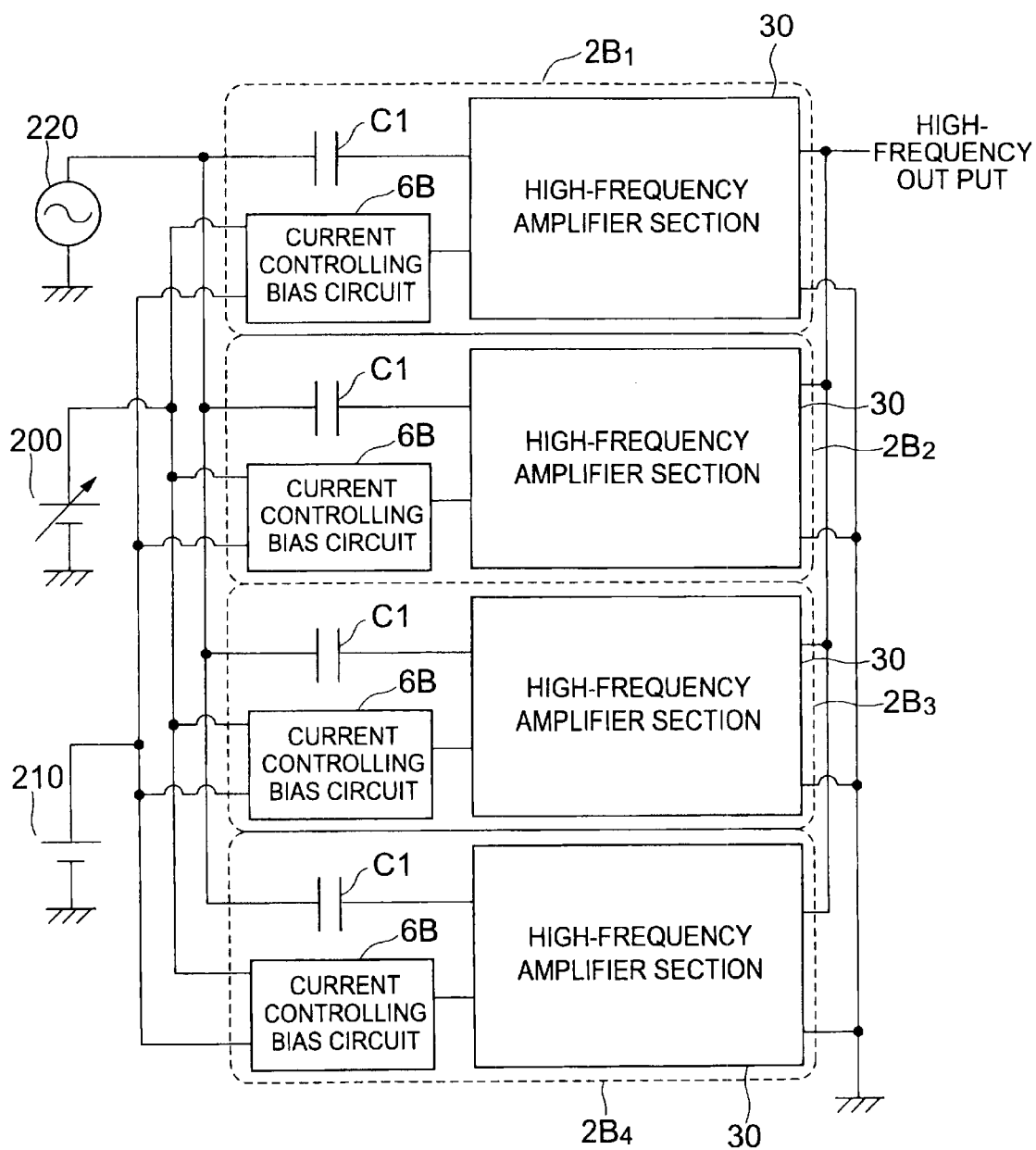
FIG. 7 is a block diagram showing a high-frequency power amplifier according to a third embodiment of the present invention.

FIG. 7 shows a high-frequency power amplifier according to a third embodiment of the present invention. The high-frequency power amplifier of this embodiment is composed of InGaP/GaAs heterojunction bipolar transistors formed on a GaAs substrate, and is expected to operate in the 2 GHz frequency band. In this embodiment, the high-frequency power amplifier includes four units, $2B_1$–$2B_4$. Each unit $2B_i$ (i=1, 2, 3, 4) includes a current controlling bias circuit (hereinafter also referred to as "bias circuit") 6B for supplying a bias current, a high-frequency amplifier section 30, to which the bias current is supplied, and an MIM capacitor C1, which receives a high-frequency input. Further, in order to send signals to and receive signals from external devices, each unit $2B_i$ includes a bias power supply terminal, a control terminal for controlling bias conditions, a high-frequency input terminal, a power output terminal, and a grounding terminal, which are not shown in FIG. 7. In addition, each unit $2B_i$ (i=1, 2, 3, 4) has minimum functions to operate as an amplifier, and the entire high-frequency power amplifier is constituted as an assembly of small amplifiers.

Figure 8:
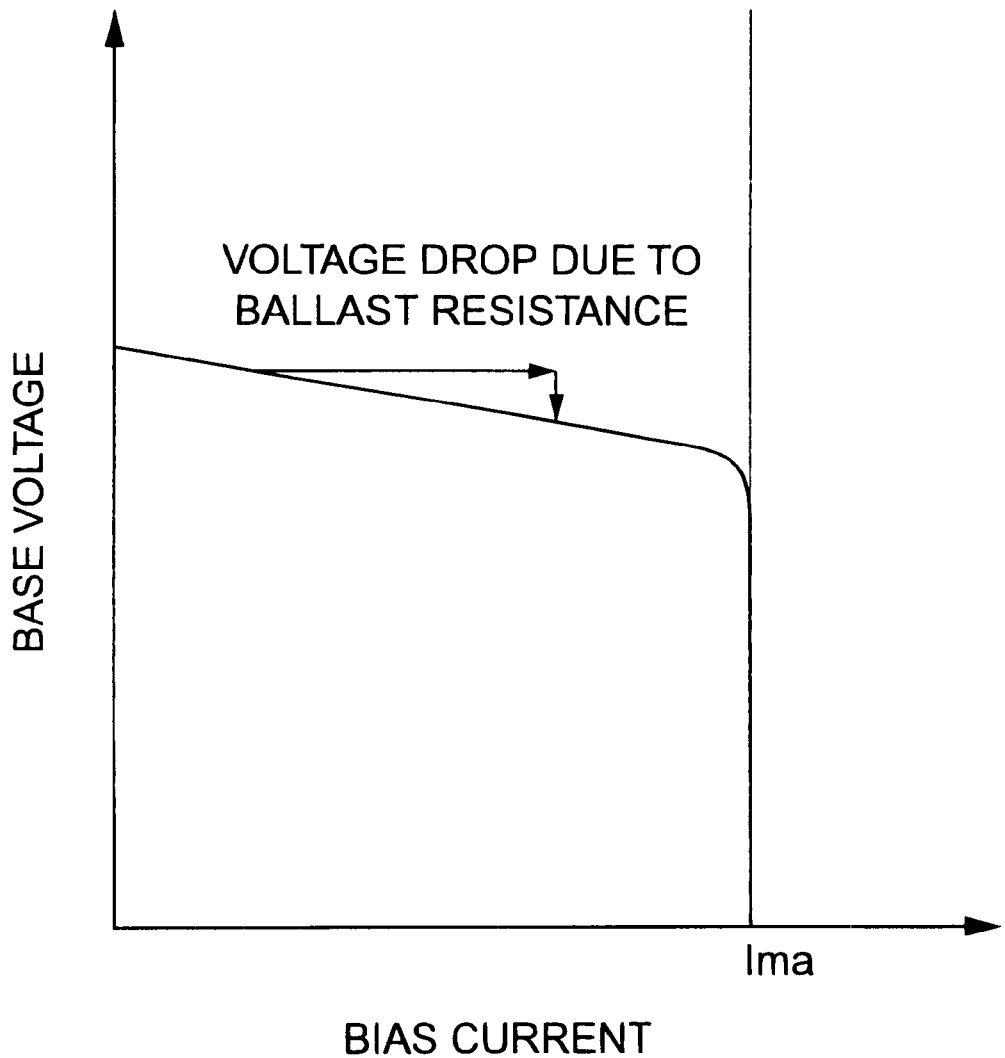
FIG. 8 is a graph showing the characteristics of a bias circuit of the third embodiment.

The characteristics of the circuit configuration of the bias circuit 6B is shown in FIG. 8. When a current exceeds the predetermined value, i.e., $I_{ma}$, the base voltage becomes 0 so that no more base current flows. By setting this predetermined current value to be equal to or less than the breakdown current value at which the transistors are destroyed (e.g., by setting the current density to be equal to or less than $1\times10^5$ A/cm$^2$), it is possible to prevent the transistors from breaking down even if they enter a thermal runaway state. Further, the bias circuit 6B includes a ballast resistor, which can be used in the conventional device, as output impedance, for preventing imbalanced operations of the units $2B_i$ (i=1, 2, 3, 4) caused by the variations in temperature. However, as mentioned previously, the resistance value of such a ballast resistor cannot be increased indiscriminately.

In this embodiment, it is possible to supply a bias voltage in response to the temperature in each unit by providing a temperature monitor in each bias circuit 6B. In this way, since imbalanced operations caused by variations in temperature do not occur, even a ballast resistor having a smaller ballast resistance value than that of the conventional device can secure the uniformity of operations better than the conventional device.

(Fourth Embodiment)

Figure 9:
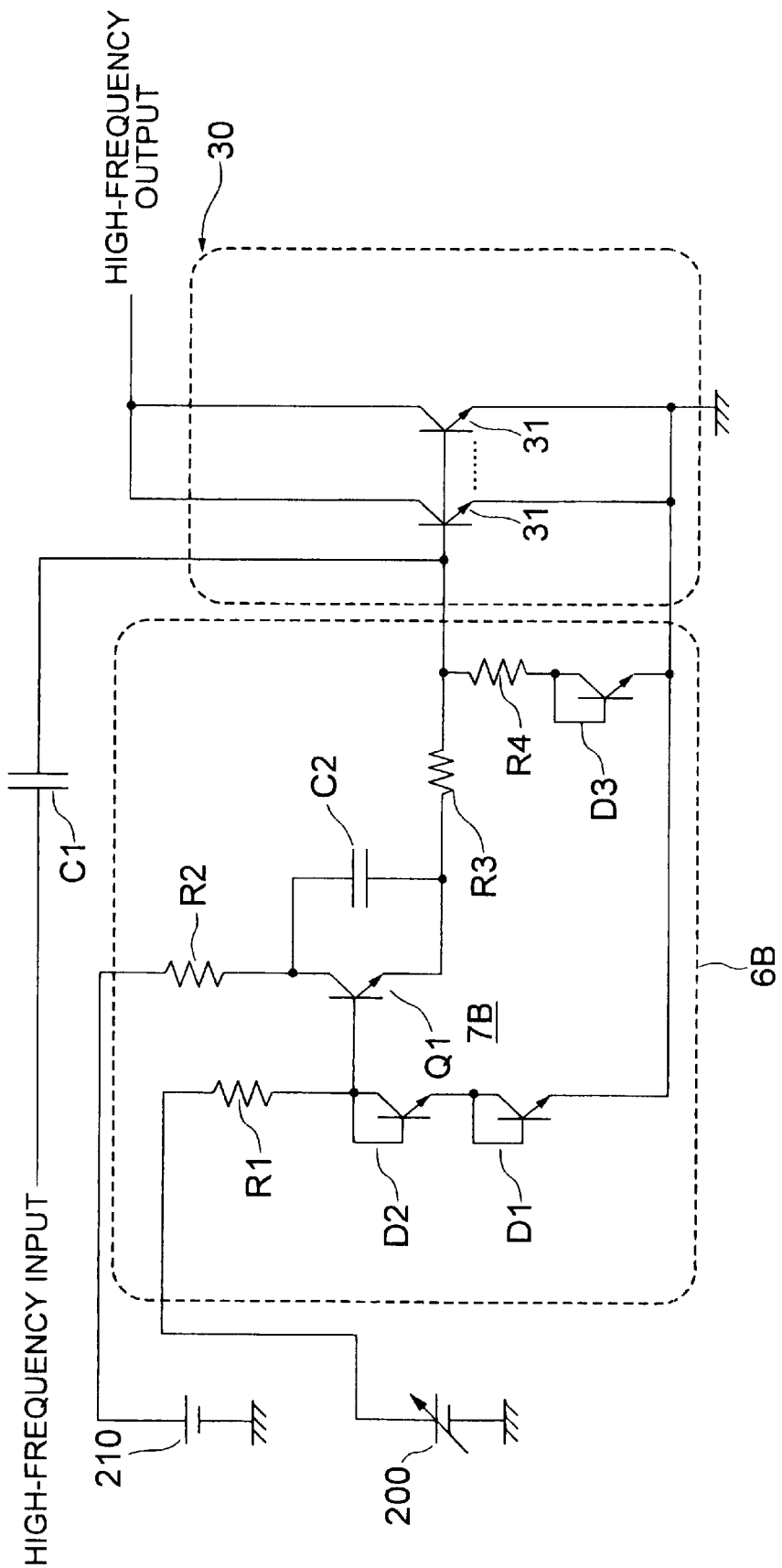
FIG. 9 is a circuit diagram showing a high-frequency power amplifier according to a fourth embodiment of the present invention.

FIG. 9 shows the circuit configuration of a high-frequency power amplifier according to a fourth embodiment of the present invention. The high-frequency power amplifier of this embodiment is composed of a plurality of units, of which only one unit is shown in FIG. 9. Each unit includes a bias circuit 6B, an MIM capacitor C1, and a high-frequency amplifier section 30.

The bias circuit 6B includes a control resistor R1 for controlling bias current, a resistor R2, a ballast resistor R3, a high-frequency inhibiting resistor R4, diodes D1–D3, an NPN-type bipolar transistor Q1, and a capacitor C2. The anode of the diode D2 is connected to a control power supply 200 via the control resistor R1, and the cathode thereof is connected to the anode of the diode D1. The cathode of the diode D1 is grounded. The collector of the transistor Q1 is connected to a bias power supply 210 via the resistor R2, the base thereof is connected to the anode of the diode D2, and the emitter thereof is connected to one end of the ballast resistor R3. The capacitor C2 is connected between the collector and the emitter of the transistor Q1. One end of the ballast resistor R3 is connected to the emitter of the transistor Q1, and the other end thereof is connected to the anode of the diode D3 via the resistor R4. The cathode of the diode D3 is grounded.

The high-frequency amplifier section 30 is composed of a plurality (in this case, eight) of NPN-type bipolar transistors 31. Each transistor 31 has an emitter area measuring 4×30 $\mu$m$^2$ in size. The collectors of the transistors 31 are commonly connected to transmit high-frequency outputs to external devices. The emitters of the transistors 31 are commonly connected and grounded. A resistor may be provided between the emitter of the transistor Q1 and the grounding terminal, although such a resistor is not shown in FIG. 9.

Each unit has minimum functions to operate as an amplifier. The entire power amplifier is constituted as an assembly of small amplifiers.

Next, the operation of the bias circuit 6B will be described. The transistor Q1, and the diodes D1 and D2 constitute a voltage generating circuit 7B, in which voltage is reduced as temperature raises by the use of the diode D1 used as a temperature monitor. That is, in the voltage generating circuit 7B, output voltage is reduced by the use of the fact that as the temperature in a diode rises, the ON voltage thereof decreases.

With such a configuration, it is possible to keep within a predetermined range the variations of bias point in each unit, caused by heat of the transistors 31. Even if there is a difference in temperature of the transistor 31 between a unit provided in the central portion of an IC chip where heat is not easily conveyed, and another unit provided in the periphery portion of the IC chip where heat is relatively easily conveyed, the bias point of the transistors 31 is adjusted unit by unit. Accordingly, uniform operations can be accomplished. Further, in order to quickly respond to the temperature, the transistors 31 of the high-frequency amplifier section 30 and the diode D1 serving as a temperature monitor in the bias circuit 6B are strongly coupled thermally on the IC chip. Specifically, as described in the explanations of the first and second embodiments, the diode D1 serving as a temperature monitor is located as close to the transistors 31 serving as a heat source as possible. This effect is enhanced by performing further thermal coupling by the use of a thick plated line. That is, as in the case of the first embodiment, ground wiring of the transistors 31 constituting the high-frequency amplifier section 30 and the diode D1 is made by the use of a thick gold-plated line, and this line is also used as a heat releasing layer. Since the common grounding line is used, the difference in temperature between the diode D1 and the transistors 31 is small, so that the temperature compensating functions are effectively carried out. Moreover, since the diode D3 for the idling current also has the temperature compensating function, the same kind of thermal coupling is performed for the diode D3. That is, as the temperature of the high-frequency amplifying transistors 31 rises, the temperature of the diode D3 also rises, thereby reducing the ON voltage thereof, hence increasing the current passing through it. Accordingly, it is possible to make the current controlling function of the bias circuit more sensitive.

Figure 10:
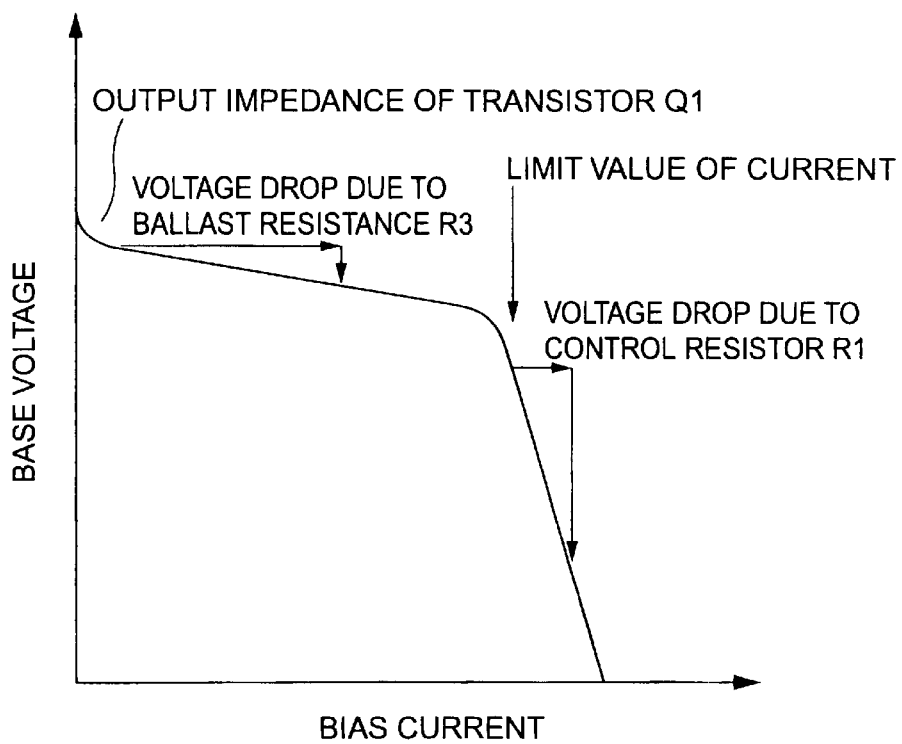
FIG. 10 is a graph showing the dependency of supply voltage on bias current of a bias circuit in the fourth embodiment.

Next, the bias current controlling operation will be described with reference to FIG. 10, which shows the dependency of the supply voltage (base voltage) on the bias current in the bias circuit 6B. The voltage change shown in the region where the bias current is at a minimum value is caused by the characteristic that the output impedance of the current supplying transistor Q1 is in inverse proportion to the supplied current. Such a variation can be eliminated by changing the area of the diode D3 for determining the idling current of the bias circuit 6B so as to increase the idling current. On the contrary, if such a variation gives no adverse effect on the operation of the circuit, it is possible to decrease the idling current, thereby reducing the power consumed by the bias circuit 6B. Alternatively, if the temperature compensating function of the diode D3 can be ignored, it is possible to replace the diode D3 with a resistor. The gradual voltage variation in the steady-operation region is caused by the output impedance of the transistor Q1 and the ballast resistor R3. Although a such a variation is required to a certain degree in order to inhibit imbalanced operations in the IC of the power amplifier, such a variation would cause a change in operation point because of a change in current, as is understood from FIG. 10. Accordingly, as mentioned previously, this value should be as small as possible.

Since thermal breakdown can be prevented by the current control function of this embodiment, the above-described value can be kept small. Accordingly, in this embodiment, only the output impedance (about 5 Ω) of the transistor Q1 operates as the ballast resistance. That is, if a large collector current flows through the high-frequency amplifying transistors 31 due to a variation in load impedance, it is possible to prevent the transistors 31 from breaking down due to thermal runaway even if the ballast resistance value of the ballast resistor R3 is 0 Ω. Accordingly, since the ballast resistance value is 0 Ω, which should have been at least 25 Ω in the conventional devices, the linear operations is improved, as described later. In the region where the current is limited to prevent the transistors from breaking down, a sharp drop in voltage is caused by the fact that the bias current is supplied via the resistor R2. That is, due to a voltage drop caused at the resistor R2, the collector voltage of the transistor Q1 decreases, thereby ultimately stopping the operation of the transistor Q1 (when the emitter-collector voltage reaches about 0V). At that time, since the bias current is supplied via the base and the emitter of the transistor Q1, the control resistor RI serves as output impedance. Since the resistance value of the control resistor R1 is about 1 kg, the output impedance varies from a few Ω to about 1 kΩ. In this way, it is possible to control the base current. However, with only the resistor R2, the transistor Q1 obtains a high-frequency gain, so that the bias circuit 6B oscillates due to high-frequency inputs. Accordingly, such problems as decrease in gain, variation in phase, and decrease in saturation output, etc., occur, which causes a problem similar to the problem of the shift in bias point.

Figure 11:
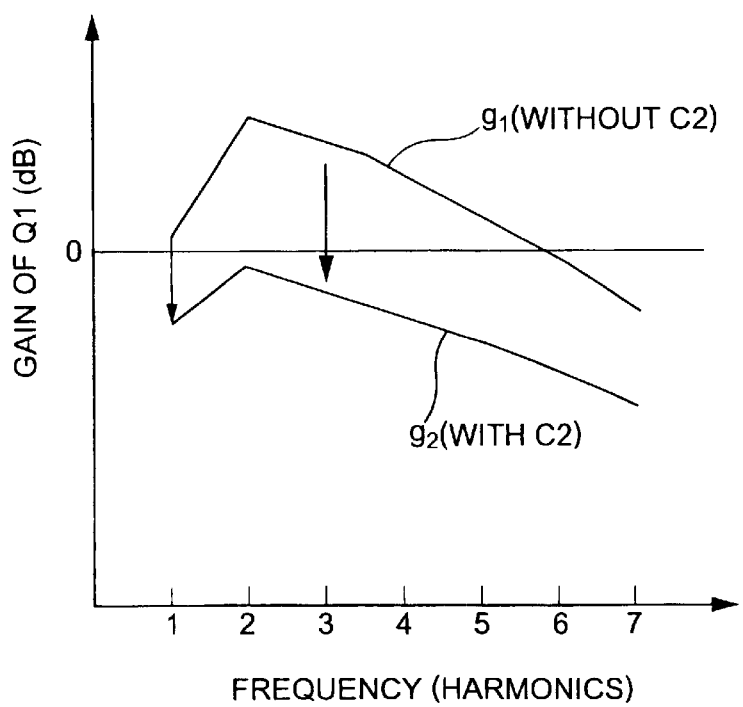
FIG. 11 is a graph showing the gain characteristics of a transistor Q1 of the bias circuit.

In this embodiment, in order to cope with these problems, the capacitor C2 is connected between the emitter and the collector of the transistor Q1. As shown by the line graph $g_2$ in FIG. 11, if the capacitor C2 is added, the gain of the transistor Q1 is less than 0 dB in all the frequency areas, thereby preventing the bias circuit 6B from oscillating in a high frequency. The line graph $g_1$ in FIG. 11 shows characteristics of the gain when the capacitor C2 is not added. The value of the capacitor C2 does not need to be large, since in operation, because of the mirror effect accompanying the gain of the transistor Q1, it contributes to the lowering of the gain as a value exceeding the actual value. In this embodiment, the power amplifier with the capacitor C2 having a value of 0.5 pF shows the same characteristics as the conventional devices. A capacitor having such a small value would not increase the chip area so much.

Figure 12:
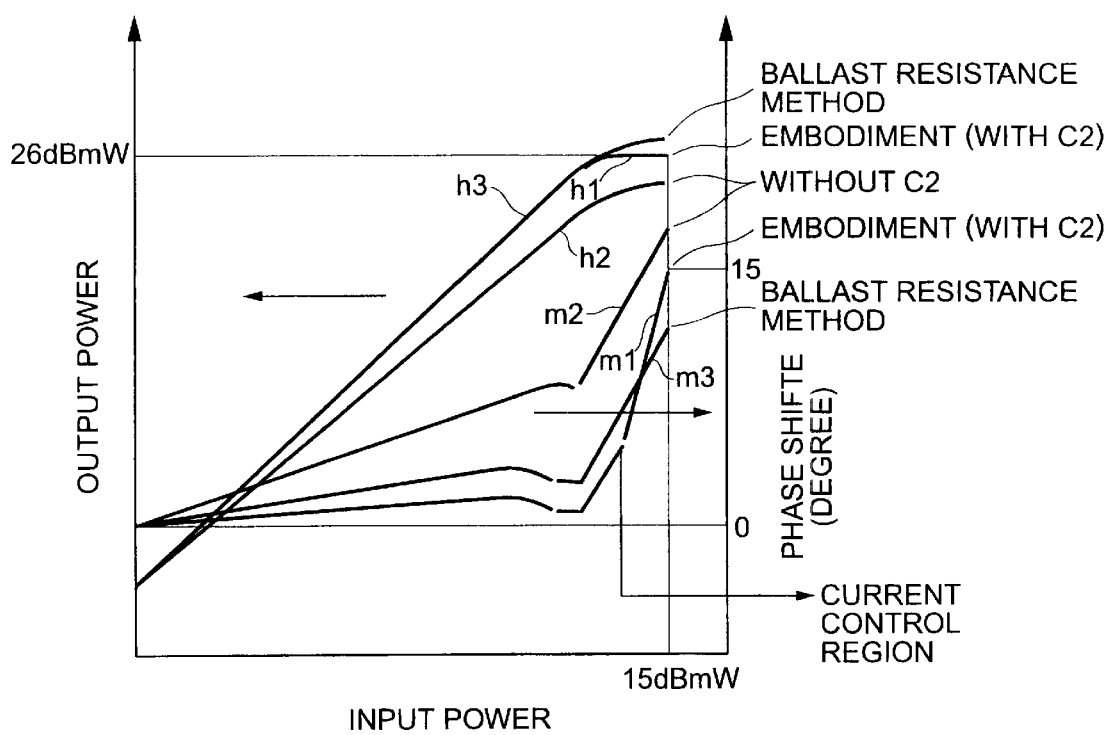
FIG. 12 is a graph showing input/output characteristics of the fourth embodiment.
Figure 13:
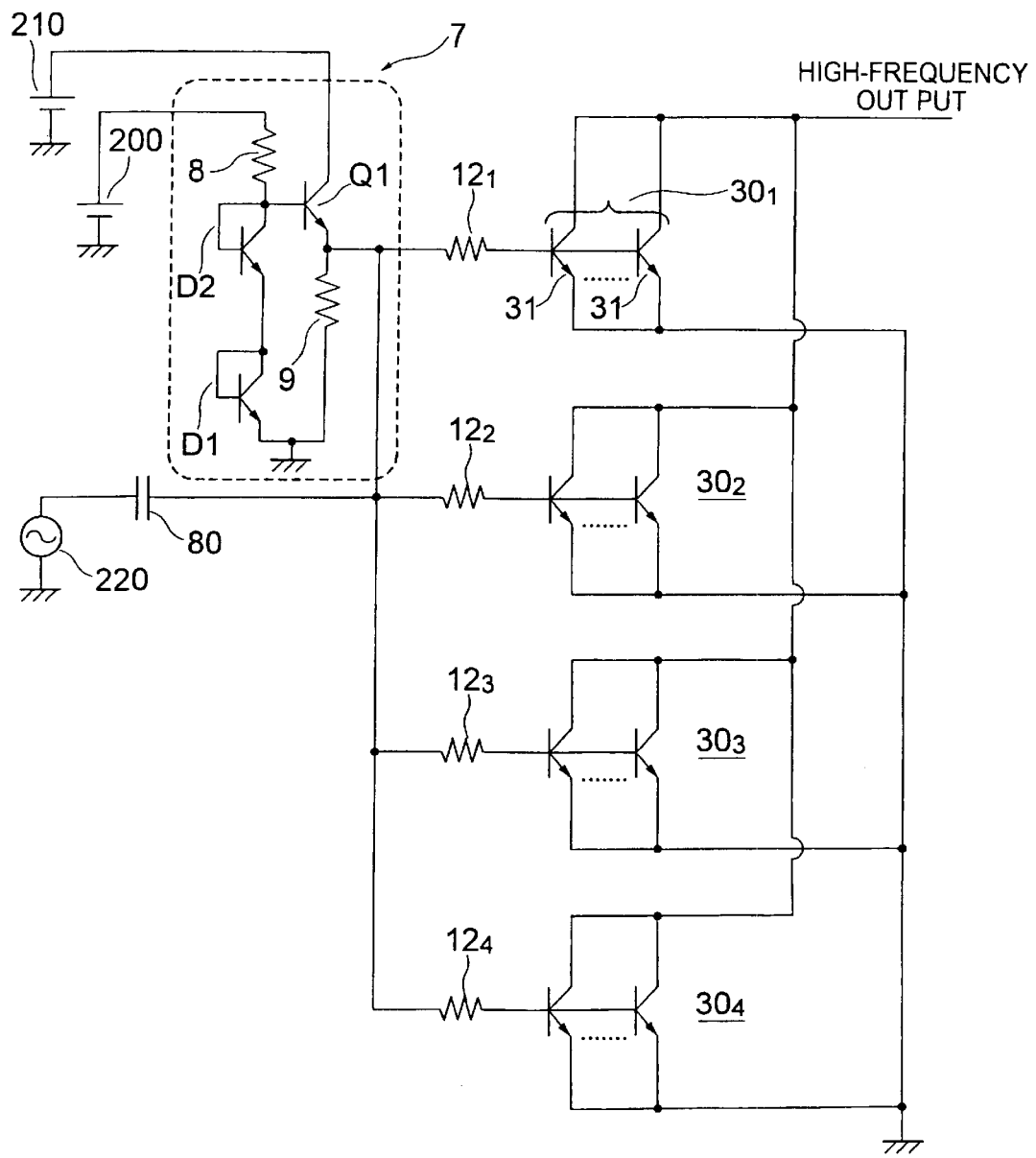
FIG. 13 is a circuit diagram showing the configuration of a conventional high-frequency power amplifier.

FIG. 12 shows input/output characteristics of a unit including the bias circuit 6B according to the present invention. The characteristics shown are obtained by a circuit having a bias power supply of 3.4V, a resistor R2 of 400 Ω, in order to limit a base current to about 5 mA or less. For the comparison purpose, the characteristics of a power amplifier having a ballast resistance of 25 Ω (as a whole, 25 Ω×8=200 Ω per a transistor), and the characteristics of a power amplifier without the capacitor C2 are also shown.

It is understood that if no capacitor C2 is included in the circuit, the characteristic of the circuit is considerably deteriorated since the potential of the transistor Q1 oscillates due to high-frequency signals (see the output power characteristic graph h2 in FIG. 12). Further, since some high-frequency signals leak out to the side of the bias circuit 6B, as the gain is reduced, the phase characteristic is deteriorated due to the shift of the bias point (see the phase characteristic graph m2 in FIG. 12).

By adding the capacitor C2, the power amplifier according to the present invention shows substantially the same output power as the power amplifier using the ballast resistance method (see the output power characteristic graphs h2 and h3 in FIG. 12). The peak saturation output power of the power amplifier using the ballast resistance method is 26.5 dBmW, which is about 0.5 dB higher than that of the present invention. This happens since the current controlling function operates to inhibit further increase in collector current. In this regard, if the present invention is applied to a power amplifier, for which the value of the saturation output is a significant matter, it is possible to obtain a high output by setting the current control value higher than that of this embodiment. Of course, in such a case, the ballast resistance value should not be 0 106 but a certain level, to secure the uniformity of operations within the IC so as to prevent the transistors 31 from breaking down due to thermal runaway. Actually, it was possible to have the same amount of the peak saturation power without causing thermal runaway by choosing the resistor R2 of 200 Ω, and the ballast resistor R3 of 12.5 Ω.

In addition, as understood from FIG. 12, the present invention improves the characteristics in the linear operation area. Input/output power characteristics of the present invention are substantially the same as those of the conventional devices, while the shift amount in phase is reduced to about half in the linear operation area (see the phrase characteristic graphs m1, m2, and m3 in FIG. 12) as compared to the conventional devices. The reason for this effect is that the ballast resistance is reduced, and the variation in bias point due to the base current is reduced. Because of such a characteristic, it is possible to provide good amplifying characteristics to power amplifiers using digital modulation methods such as the CDMA (Code Division Multiple Access) modulation method, in which linear operations are important. Power amplifiers suitable for the CDMA method were constituted by using the conventional ballast resistance method and by using the present invention. The power added efficiency of the one using the conventional ballast resistance method was 38% when the output is 28.5 dBmW, while the power added efficiency of the one using four units according to the present invention was 42%. Of course, no transistor 31 was destroyed due to the variation in load. Thus, it was possible to accomplish good characteristics.

As described above, according to the present invention, it is possible to effectively prevent decrease in gain and decrease in peak output power, and to obtain good linear characteristics.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A high-frequency power amplifier comprising:
   a plurality of high-frequency amplifier sections, each being composed of bipolar transistors;
   a plurality of capacitors each corresponding to one of said high-frequency power amplifier sections, one end of each capacitor being connected to bases of the bipolar transistors of the corresponding high-frequency power amplifier section, and the other end thereof being connected to a high-frequency signal source: and
   a plurality of bias circuits each corresponding to one of said high-frequency power amplifier sections, applying a bias voltage to the bases of the bipolar transistors of the corresponding high-frequency power amplifier section,
   wherein each bias circuit is located close to the corresponding one of said high-frequency power amplifier sections, and includes a bias voltage lowering section lowering the bias voltage in response to an increase in temperature of the bipolar transistors,
   wherein each of said bias circuits includes a ballast resistor and a voltage generating circuit generating a voltage and supplying the generated voltage to the bases of the bipolar transistors as said bias voltage,
   wherein said voltage generating circuit includes a first diode, of which a cathode is grounded, a second diode, of which a cathode is connected to the first diode and an anode is connected to a control power supply via a control resistor, and a bipolar transistor, of which a collector is connected to a bias power supply, a base is connected to the anode of said second diode, and an emitter is connected to said ballast resistor, and
   wherein said first diode is located close to the bipolar transistors of the corresponding high-frequency amplifier section.

2. A high-frequency power comprising:
   a plurality of high-frequency amplifier sections, each being composed of bipolar transistors;
   a plurality of capacitors each corresponding to one of said high-frequency power amplifier sections, one end of each capacitor being connected to bases of the bipolar transistors of the corresponding high-frequency power amplifier section, and the other end thereof being connected to a high-frequency signal source; and
   a plurality of bias circuits each corresponding to one of said high-frequency power amplifier sections, applying a bias voltage to the bases of the bipolar transistors of the corresponding high-frequency power amplifier section,
   wherein each bias circuit is located close to the corresponding one of said high-frequency power amplifier sections, and includes a bias voltage lowering section lowering the bias voltage in response to an increase in temperature of the bipolar transistors, and
   wherein said bias voltage lowering section includes a diode connected to the bases of the bipolar transistors via resistor to block a high-frequency signal.

3. The high-frequency power amplifier according to claim 2, wherein a cathode of the diode of said bias voltage lowering section is thermally coupled to a metal wiring connected to emitters of the bipolar transistors in the corresponding high-frequency amplifier section.

4. The high-frequency power amplifier according to claim 3, wherein each of said bias circuits includes a ballast resistor and a voltage generating circuit generating a voltage and supplying the generated voltage to the bases of the bipolar transistors as said bias voltage.

5. The high-frequency power amplifier according to claim 4, wherein said voltage generating circuit includes a first diode, of which a cathode is grounded, a second diode, of which a cathode is connected to the first diode and an anode is connected to a control power supply via a control resistor, and a bipolar transistor, of which a collector is connected to a bias power supply, a base is connected to the anode of said second diode, and an emitter is connected to said ballast resistor, and wherein said first diode is located close to the bipolar transistors of the corresponding high-frequency amplifier section.

6. A high-frequency power amplifier comprising:
   a plurality of high-frequency amplifier sections, each being composed of bipolar transistors;
   a plurality of capacitors each corresponding to one of said high-frequency power amplifier sections, one end of each capacitor being connected to bases of the bipolar transistors of the corresponding high-frequency power amplifier section, and the other end thereof being connected to a high-frequency signal source;
   a plurality of bias circuits each corresponding to one of said high-frequency power amplifier sections, applying a bias voltage to the bases of the bipolar transistors of the corresponding high-frequency power amplifier section; and a voltage generating circuit having a first diode, of which a cathode is grounded, a second diode, of which a cathode is connected to the first diode and an anode is connected to a control power supply via a control resistor, and a bipolar transistor, of which a collector is connected to a bias power supply, a base is connected to the anode of the second diode, and an emitter is grounded via a resistor, the emitter of the bipolar transistor supplying said bias voltage to said bias circuits via ballast resistors, wherein each bias circuit is located close to the corresponding one of said high-frequency power amplifier sections, and includes a bias voltage lowering section lowering the bias voltage in response to an increase in temperature of the bipolar transistors.

7. A high-frequency power amplifier comprising:

a plurality of high-frequency amplifier sections, each being composed of bipolar transistors;

a plurality of capacitors each corresponding to one of said high-frequency power amplifier sections, one end of each capacitor being connected to bases of the bipolar transistors of the corresponding high-frequency amplifier section, and the other end thereof being connected to a high-frequency signal source; and a plurality of bias circuits each corresponding to one of said high-frequency power amplifier sections, applying a bias voltage to the bases of the bipolar transistors of the corresponding high-frequency power amplifier section, wherein each of said bias circuits has a first impedance when a base current supplied to the bases of the bipolar transistors in the corresponding high-frequency power amplifier section does not exceed a predetermined value, and has a second impedance larger than said first impedance when said base current exceeds said predetermined value so that said bias voltage becomes zero volts.

8. The high-frequency power amplifier according to claim 7, wherein each of said bias circuits includes a first diode, of which a cathode is grounded, a second diode, of which a cathode is connected to the first diode and an anode is connected to a control power supply via a control resistor, a bipolar transistor, of which a collector is connected to a bias power supply via a resistor, a base is connected to the anode of said second diode, and an emitter is connected to the bases of the bipolar transistors of the corresponding high-frequency amplifier section, and a second capacitor connected between the collector and the emitter of said second bipolar transistor.

9. The high-frequency power amplifier according to claim 8, wherein said ballast resistor is an output impedance of said second bipolar transistor.

10. The high-frequency power amplifier according to claim 8, wherein each of said bias circuits include a third diode, of which an anode is connected to the bases of the bipolar transistors in the corresponding high-frequency amplifier section via a high-frequency inhibiting resistor, and a cathode is grounded.

* * * * *